United States Patent
Chung et al.

(10) Patent No.: US 12,550,601 B2
(45) Date of Patent: Feb. 10, 2026

(54) DISPLAY APPARATUS AND METHOD OF MANUFACTURING THE SAME

(71) Applicant: Samsung Display Co., Ltd., Yongin-Si (KR)

(72) Inventors: Yungbin Chung, Yongin-si (KR); Eunjin Kwak, Yongin-si (KR); Jihye Han, Yongin-si (KR); Chulmin Bae, Yongin-si (KR); Sangwook Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 697 days.

(21) Appl. No.: 17/939,360

(22) Filed: Sep. 7, 2022

(65) Prior Publication Data

US 2023/0172040 A1   Jun. 1, 2023

(30) Foreign Application Priority Data

Nov. 29, 2021   (KR) .................. 10-2021-0167722

(51) Int. Cl.

| | |
|---|---|
| *H10K 71/80* | (2023.01) |
| *C23C 16/40* | (2006.01) |
| *C23C 16/50* | (2006.01) |
| *H10K 59/12* | (2023.01) |
| *H10K 71/00* | (2023.01) |
| *H10K 77/10* | (2023.01) |
| *H10K 102/00* | (2023.01) |

(52) U.S. Cl.
CPC ........... *H10K 71/80* (2023.02); *C23C 16/401* (2013.01); *C23C 16/50* (2013.01); *H10K 59/12* (2023.02); *H10K 71/00* (2023.02); *H10K 77/111* (2023.02); *H10K 59/1201* (2023.02); *H10K 2102/311* (2023.02)

(58) Field of Classification Search
None
See application file for complete search history.

(56) References Cited

U.S. PATENT DOCUMENTS

| | | |
|---|---|---|
| 8,815,620 B2 | 8/2014 | Park et al. |
| 9,947,568 B2 | 4/2018 | Yasumoto et al. |
| 10,005,263 B2 | 6/2018 | Jung et al. |
| 10,608,117 B2 | 3/2020 | Lee et al. |
| 2011/0100458 A1 | 5/2011 | Kang et al. |
| 2021/0050536 A1 | 2/2021 | Woo et al. |

(Continued)

FOREIGN PATENT DOCUMENTS

| | | |
|---|---|---|
| CN | 109427844 A | 3/2019 |
| KR | 10-1089715 B1 | 12/2011 |
| KR | 10-2014-0019699 A | 2/2014 |

(Continued)

*Primary Examiner* — Kyoung Lee
(74) *Attorney, Agent, or Firm* — Innovation Counsel LLP

(57) ABSTRACT

Provided are a display apparatus, which may be easily separated from a carrier substrate, and a method of manufacturing the same. The method of manufacturing a display apparatus includes: forming, on a carrier substrate, a first inorganic layer including silicon oxide; plasma-treating the first inorganic layer by using nitrous oxide gas; after the plasma-treating, forming a display substrate on the first inorganic layer; forming a display element layer above the display substrate; and separating the display substrate from the carrier substrate.

19 Claims, 6 Drawing Sheets

(56) References Cited

U.S. PATENT DOCUMENTS

2021/0167329 A1* 6/2021 Adachi ................. H05B 33/10

FOREIGN PATENT DOCUMENTS

| KR | 10-2015-0120376 A | 10/2015 |
| KR | 1020160104790 A | 9/2016 |
| KR | 1020190044159 A | 4/2019 |
| KR | 10-2068713 B1 | 1/2020 |
| KR | 10-2021-0019633 A | 2/2021 |

* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0167722, filed on Nov. 29, 2021, in the Korean Intellectual Property Office, the disclosure of which is incorporated by reference herein in its entirety.

BACKGROUND

1. Field

One or more embodiments generally relate to a display apparatus and a method of manufacturing the same, and more particularly, to a display apparatus capable of being separated from a carrier substrate, and a method of manufacturing the same.

2. Description of the Related Art

In general, the manufacture of a flexible display apparatus includes a process of forming a flexible display substrate on a carrier substrate. After forming a display element layer on a display substrate formed on a carrier substrate, the display substrate is separated from the carrier substrate to manufacture a display apparatus.

SUMMARY

However, a method of manufacturing a display apparatus according to the related art involves a difficulty in terms of separating a display substrate from a carrier substrate.

One or more embodiments include a display apparatus, which may be easily separated from a carrier substrate. However, the above objective is an example, and the scope of the embodiments of the present disclosure is not limited by the above objective.

Additional aspects will be set forth in part in the description which follows and, in part, will be apparent from the description, or may be learned by practice of the presented embodiments of the disclosure.

According to one or more embodiment, a method of manufacturing a display apparatus, includes steps of: forming, on a carrier substrate, a first inorganic layer including silicon oxide, plasma-treating the first inorganic layer by using nitrous oxide gas ($N_2O$), after the plasma-treating, forming a display substrate on the first inorganic layer, forming a display element layer disposed on the display substrate, and separating the display substrate from the carrier substrate.

The plasma-treating the first inorganic layer is accomplished by plasma-treating an upper surface of the first inorganic layer.

The plasma-treating the first inorganic layer is accomplished by varying a content of oxygen per unit volume in the first inorganic layer according to positions within the first inorganic layer.

The plasma-treating the first inorganic layer is accomplished by making the content of oxygen per unit volume in the first inorganic layer increase from a bottom surface of the first inorganic layer which faces the carrier substrate to an upper surface of the first inorganic layer.

The plasma-treating the first inorganic layer is accomplished by making a content of oxygen per unit volume in a first portion of the first inorganic layer facing away from the carrier substrate be higher than a content of oxygen per unit volume in a second portion of the first inorganic layer, the second portion being closer than the first portion to the carrier substrate.

The plasma-treating the first inorganic layer is accomplished by making a content of oxygen per unit volume in a third portion of the first inorganic layer be higher from a bottom surface of the third portion facing the carrier substrate to an upper surface of the third portion the third portion being located between the first portion and the second portion.

The plasma-treating the first inorganic layer is accomplished by varying a content of hydrogen per unit volume in the first inorganic layer according to positions within the first inorganic layer.

The plasma-treating the first inorganic layer is accomplished by making the content of hydrogen per unit volume of the first inorganic layer decrease from the bottom surface of the first inorganic layer which faces the carrier substrate to the upper surface of the first inorganic layer.

The plasma-treating the first inorganic layer is accomplished by making a content of hydrogen per unit volume in a first portion of the first inorganic layer facing away from the carrier substrate be lower than a content of hydrogen per unit volume in a second portion of the first inorganic layer, the second portion being closer than the first portion to the carrier substrate.

The plasma-treating the first inorganic layer is accomplished by making a content of hydrogen per unit volume in a third portion of the first inorganic layer be lower from a bottom surface of the third portion facing the carrier substrate to an upper surface of the third portion, the third portion being located between the first portion and the second portion.

The method may further include, between the forming of the display substrate and the forming of the display element layer, forming, on the display substrate, a first barrier layer including silicon oxide.

The method may further include, between the forming of the first barrier layer and the forming of the display element layer, forming, on the display substrate, a second barrier layer including silicon oxide.

The forming of the second barrier layer is accomplished by forming the second barrier layer such that a content of oxygen per unit volume of the second barrier layer is lower than a content of oxygen per unit volume of the first barrier layer.

The forming of the second barrier layer is accomplished by forming the second barrier layer such that a content of hydrogen per unit volume of the second barrier layer is higher than a content of hydrogen per unit volume of the first barrier layer.

The separating the display substrate from the carrier substrate is accomplished by separating the display substrate from the first inorganic layer.

According to one or more embodiments, a display apparatus includes a display substrate, a display element layer disposed on one surface of the display substrate, and a second inorganic layer disposed on an other surface of the display substrate and including silicon oxide, wherein a content of oxygen per unit volume of the second inorganic layer increases in a direction toward the display substrate.

A content of hydrogen per unit volume of the second inorganic layer may decrease from a bottom surface of the second inorganic layer to an upper surface of the second inorganic layer which faces the display substrate.

The display apparatus may further include a first barrier layer arranged between the display substrate and the display element layer, and a second barrier layer arranged between the first barrier layer and the display element layer.

A content of oxygen per unit volume of the second barrier layer may be lower than a content of oxygen per unit volume of the first barrier layer.

A content of hydrogen per unit volume of the second barrier layer may be higher than a content of hydrogen per unit volume of the first barrier layer.

Other aspects, features, and advantages other than those described above will become apparent from the accompanying drawings, the appended claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
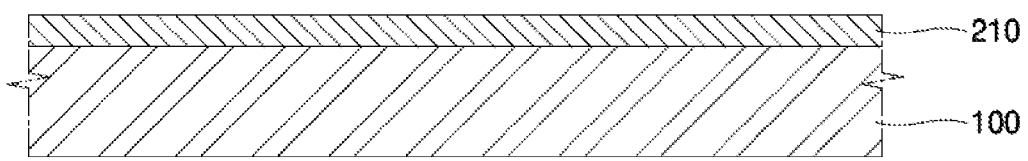
FIG. 1 is a schematic cross-sectional view for describing an operation of forming a first inorganic layer, among operations included in a method of manufacturing a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described in detail with reference to the accompanying drawings, and in the description with reference to the drawings, like reference numerals refer to like elements and redundant descriptions thereof will be omitted.

In the embodiments below, it will be understood when various elements such as a layer, a film, an area, or a plate is referred to as being "on" or "above" another element, it can be directly on or above the other element, or an intervening element may also be present. Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an x-axis, a y-axis, and a z-axis may be at right angles or may also indicate different directions from one another, which are not at right angles.

It will be understood that although the terms "first," "second," etc. may be used herein to describe various elements, these elements should not be limited by these terms. These terms are only used to distinguish one element from another.

Singular expressions, unless defined otherwise in contexts, include plural expressions.

In the embodiments below, it will be further understood that the terms "comprise" and/or "have" used herein specify the presence of stated features or elements, but do not preclude the presence or addition of one or more other features or elements.

Herein, "A and/or B" refers to A, B, or A and B. In addition, "at least one of A and B" refers to A, B, or A and B.

FIGS. 1, 2, 3, 4, 5, 6 and 7 are cross-sectional views for describing a method of manufacturing a display apparatus, according to an embodiment. According to the method of manufacturing a display apparatus, according to the present embodiment, first, a first inorganic layer 210 may be formed on a carrier substrate 100, as illustrated in FIG. 1, which is a schematic cross-sectional view for describing an operation of forming a first inorganic layer.

When manufacturing a flexible display apparatus or a bendable display apparatus or the like, a display substrate 300 (see FIG. 3) that is flexible or bendable is to be formed. In forming of the display substrate 300, the carrier substrate 100 may be used. Therefore, the method of manufacturing a display apparatus may include a process of forming the display substrate 300 on the carrier substrate 100 and a process of forming a display element layer 500 (see FIG. 6) on the display substrate 300. The carrier substrate 100 may support the display substrate 300 and the display element layers 500 from below during a manufacturing process of a display apparatus. To accomplish this end, the carrier substrate 100 needs to be rigid. The carrier substrate 100 may include, for example, glass. In detail, the carrier substrate 100 may include glass including silicon oxide ($SiO_x$). The carrier substrate 100 may also further include a small amount of impurities. For example, the impurities may include aluminum (Al), potassium (K), or sodium (Na).

Prior to forming the display substrate 300 on the carrier substrate 100, the first inorganic layer 210 is formed on the carrier substrate 100. Then, the display substrate 300 may be formed on the first inorganic layer 210. That is, the first inorganic layer 210 may be arranged between the carrier substrate 100 and the display substrate 300. The first inorganic layer 210 may include an inorganic layer including silicon oxide. However, the present disclosure is not limited thereto. For example, the first inorganic layer 210 may include an inorganic layer including silicon nitride or silicon oxynitride. The first inorganic layer 210 may be formed by plasma enhanced chemical vapor deposition (PECVD), chemical vapor deposition (CVD), or atomic layer deposition (ALD). As the first inorganic layer 210 is formed using a deposition method, compared to the carrier substrate 100, there may be no impurities in the first inorganic layer 210 or the impurities may be minimized.

Figure 2:
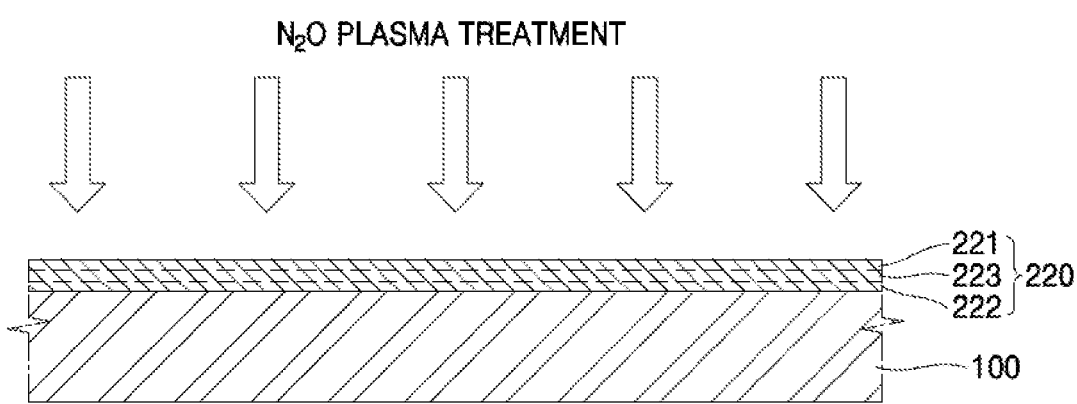
FIG. 2 is a schematic cross-sectional view for describing an operation of performing plasma treatment, among operations included in a method of manufacturing a display apparatus, according to an embodiment.

Next, as illustrated in FIG. 2, which is a schematic cross-sectional view for explaining a plasma treatment operation, the first inorganic layer 210 is plasma-treated using nitrous oxide ($N_2O$) gas.

In detail, the first inorganic layer 210 may be plasma-treated by generating plasma by applying a high-frequency electric field to nitrous oxide gas and surface-treating an upper surface of the first inorganic layer 210 by using the plasma. As such, when plasma treatment is performed using nitrous oxide gas, a flow rate of the nitrous oxide gas may be, for example, about 20,000 sccm to about 100,000 sccm, and a processing time of the plasma treatment using nitrous oxide gas may be, for example, about 2 seconds to about 180 seconds. Power may be about 5,000 W to about 10,000 W. Pressure may be applied during the plasma treatment using nitrous oxide gas. For example, the pressure may be set between about 500 mTorr and about 1,000 mTorr.

As described above, as the plasma treatment is performed using nitrous oxide gas, contents of some of components of the first inorganic layer 210 may vary. That is, a plasma-treated first inorganic layer 220 illustrated in FIG. 2 may be the first inorganic layer 210, in which the contents of components thereof are varied as the plasma treatment is performed thereon using nitrous oxide gas.

For example, as the plasma treatment is performed using nitrous oxide gas, a content of oxygen per unit volume in the plasma-treated first inorganic layer 220 may vary according to positions in the plasma-treated first inorganic layer 220. In detail, a content of oxygen per unit volume may increase in a direction away from the carrier substrate 100, for example, from a bottom surface of the plasma-treated first inorganic layer 220 toward an upper surface of the plasma-treated first inorganic layer 220. Also, a content of oxygen per unit volume in a first portion 221 of the plasma-treated first inorganic layer 220 facing away from the carrier substrate 100 may be higher than a content of oxygen per unit volume in a second portion 222 of the plasma-treated first inorganic layer 220 that is more adjacent to the carrier substrate 100. In this case, a content of oxygen per unit volume in a third portion 223 disposed between the first portion 221 and the second portion 222 may be higher from a bottom surface of the third portion 223 facing the carrier substrate 100 to an upper surface of the third portion 223 facing away from the carrier substrate 100.

As the plasma treatment is performed using nitrous oxide gas, a content of hydrogen per unit volume in the plasma-treated first inorganic layer 220 may vary according to positions thereof in the plasma-treated first inorganic layer 220. In detail, a content of hydrogen per unit volume may decrease in a direction away from the carrier substrate 100, for example, from the bottom surface of the plasma-treated first inorganic layer 220 to the upper surface of the plasma-treated first inorganic layer 220. Also, a content of hydrogen per unit volume in the first portion 221 facing away from the carrier substrate 100 may be lower than a content of hydrogen per unit volume in the second portion 222 of the plasma-treated first inorganic layer 220 that is more adjacent to the carrier substrate 100. In this case, a content of hydrogen per unit volume in the third portion 223 disposed between the first portion 221 and the second portion 222 may decrease from the bottom surface of the third portion 223 facing the carrier substrate 100 to the upper surface of the third portion 223. That is, a content of hydrogen per unit volume for the first portion 221 is generally lower than that for the third portion 223, and a content of hydrogen per unit volume for the third portion 223 is generally lower than that for the second portion 222.

In the plasma treatment using nitrous oxide gas, oxygen is supplied to the first inorganic layer 210 before plasma treatment, the content of oxygen per unit volume in the plasma-treated first inorganic layer 220 is higher than the content of oxygen per unit volume in the first inorganic layer 210 before plasma treatment. In addition, the content of hydrogen per unit volume in the plasma-treated first inorganic layer 220 is lower than the content of hydrogen per unit volume in the first inorganic layer 210 before plasma treatment. Accordingly, as the number of hydroxyl groups included in the first inorganic layer 210 before plasma treatment is reduced, the plasma-treated first inorganic layer 220 has fewer hydroxyl groups than the number of hydroxyl groups of the first inorganic layer 210 before plasma treatment.

Figure 3:
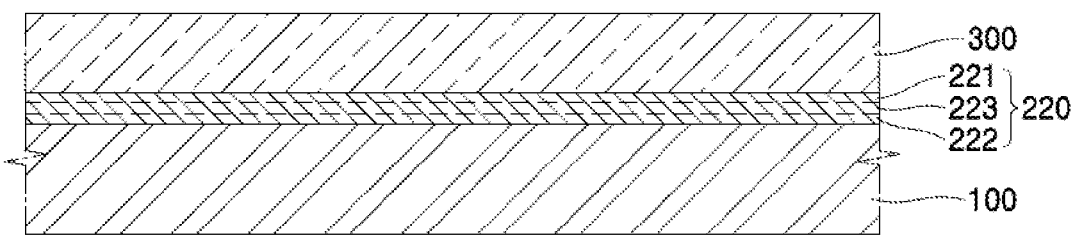
FIG. 3 is a schematic cross-sectional view for describing an operation of forming a display substrate, among operations included in a method of manufacturing a display apparatus, according to an embodiment.

After the first inorganic layer 210 before plasma treatment is plasma-treated by using nitrous oxide gas, the display substrate 300 may be formed on the plasma-treated first inorganic layer 220 as illustrated in FIG. 3. As described above, the display substrate 300 needs to be flexible or bendable. In this case, the display substrate 300 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate. Various modifications may also be made to the carrier substrate 100; for example, the carrier substrate 100 may have a multi-layer structure including two layers including the above-described polymer resin and an inorganic layer that is arranged therebetween and includes silicon oxide, silicon nitride or silicon oxynitride.

Figure 4:
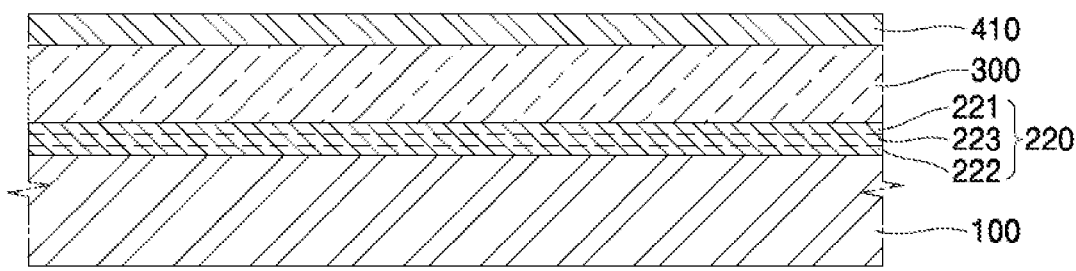
FIG. 4 is a schematic cross-sectional view for describing an operation of forming a first barrier layer, among operations included in a method of manufacturing a display apparatus, according to an embodiment.
Figure 5:
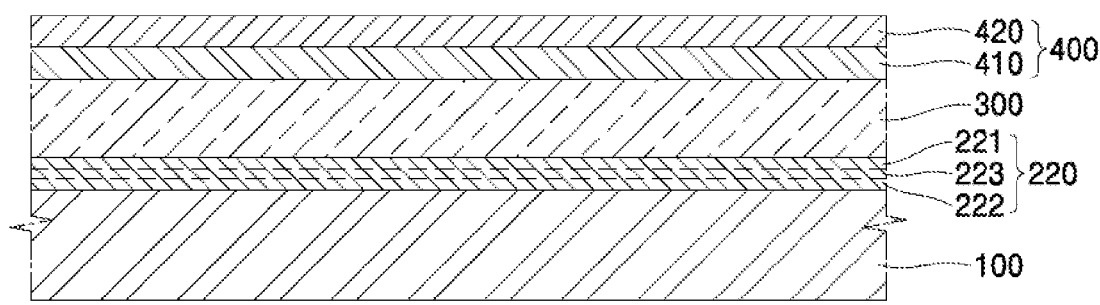
FIG. 5 is a schematic cross-sectional view for describing an operation of forming a second barrier layer, among operations included in a method of manufacturing a display apparatus, according to an embodiment.

Next, as illustrated in FIGS. 4 and 5, operations of forming the first barrier layer 410 and forming the second barrier layer 420 are performed. As such, a barrier layer 400 may be formed on the display substrate 300.

The barrier layer 400 may increase the flatness of an upper surface of the display substrate 300 and prevent diffusion of metal atoms or impurities or the like from the display substrate 300 to the display element layer 500 (see FIG. 6) thereabove. The barrier layer 400 may include an inorganic layer including silicon oxide. However, the present disclosure is not limited thereto. For example, the barrier layer 400 may include an inorganic layer including silicon nitride or silicon oxynitride. The barrier layer 400 may be formed by PECVD, CVD, or ALD.

Electrostatic attraction may be generated between the display substrate 300 and the barrier layer 400, as between the display substrate 300 and the plasma-treated first inorganic layer 220. A bottom surface of the barrier layer 400 is in contact with the display substrate 300, and as the flatness of the bottom surface of the barrier layer 400 increases, a surface area where the barrier layer 400 and the display substrate 300 come into contact with each other is reduced. When the surface area where the barrier layer 400 and the display substrate 300 are in contact with each other is reduced, the electrostatic attraction between the barrier layer 400 and the display substrate 300 may be reduced. That is, when the flatness of the bottom surface of the barrier layer 400 is relatively high, the electrostatic attraction between the display substrate 300 and the barrier layer 400 may be relatively small.

Conversely, the lower the flatness of the bottom surface of the barrier layer 400, the larger the surface area where the barrier layer 400 and the display substrate 300 are in contact with each other. When the surface area of contact between the barrier layer 400 and the display substrate 300 increases, the electrostatic attraction between the barrier layer 400 and the display substrate 300 may increase. That is, when the flatness of the bottom surface of the barrier layer 400 is relatively low, the electrostatic attraction between the display substrate 300 and the barrier layer 400 may be relatively large.

The barrier layer 400 may be formed by PECVD by using a source gas including nitrous oxide gas and silane gas. However, the present disclosure is not limited thereto, and the source gas may further include oxygen ($O_2$) gas. By adjusting an amount of silane gas in a process of forming the barrier layer 400, the flatness of the barrier layer 400 may be adjusted. In detail, when a source gas contains a small amount of silane gas, a formation rate of the barrier layer 400 may decrease, and accordingly, the flatness of the formed barrier layer 400 may increase. Conversely, when the source gas includes a large amount of silane gas, the formation rate of the barrier layer 400 may increase, and accordingly, the flatness of the formed barrier layer 400 may decrease.

The barrier layer 400 may include a plurality of barrier layers. In detail, the first barrier layer 410 including silicon oxide may be formed on the display substrate 300, and the second barrier layer 420 including silicon oxide may be formed on the first barrier layer 410. However, the present disclosure is not limited thereto. For example, the first barrier layer 410 and/or the second barrier layer 420 may include silicon nitride or silicon oxynitride.

The flatness of the first barrier layer 410 may be different from the flatness of the second barrier layer 420. In order to reduce electrostatic attraction between the display substrate 300 and the first barrier layer 410, the first barrier layer 410 may have a relatively high flatness. In this case, as a source gas of the first barrier layer 410 includes a small amount of silane gas, a formation rate of the first barrier layer 410 may be relatively low. In contrast, a source gas of the second barrier layer 420 may include a large amount of silane gas. Accordingly, a formation rate of the second barrier layer 420 may be higher than the formation rate of the first barrier layer 410, and the flatness of the second barrier layer 420 may be lower than the flatness of the first barrier layer 410.

As described above, by making the amount of the silane gas contained in the source gas of the first barrier layer 410 to be different from the amount of the silane gas contained in the source gas of the second barrier layer 420, the formation rate of the first barrier layer 410 and the formation rate of the second barrier layer 420 may be made to be different from each other. In this case, contents of components of the first barrier layer 410 and contents of components of the second barrier layer 420 may be different from each other.

For example, the first barrier layer 410 and the second barrier layer 420 may be formed such that a content of oxygen per unit volume of the first barrier layer 410 is different from a content of oxygen per unit volume of the second barrier layer 420. In detail, the amount of the silane gas included in the source gas of the first barrier layer 410 may be less than the amount of the silane gas included in the source gas of the second barrier layer 420. Accordingly, the first barrier layer 410 may be formed such that the content of oxygen per unit volume of the first barrier layer 410 is higher than the content of oxygen per unit volume of the second barrier layer 420. That is, the second barrier layer 420 may be formed such that the content of oxygen per unit volume of the second barrier layer 420 is lower than the content of oxygen per unit volume of the first barrier layer 410. In this case, as described above, the formation rate of the first barrier layer 410 may be slower than the formation rate of the second barrier layer 420.

In addition, the first barrier layer 410 and the second barrier layer 420 may be formed such that the content of hydrogen per unit volume of the first barrier layer 410 is different from the content of hydrogen per unit volume of the second barrier layer 420. In detail, the amount of the silane gas included in the source gas of the first barrier layer 410 may be less than the amount of the silane gas included in the source gas of the second barrier layer 420. Accordingly, the first barrier layer 410 may be formed such that the content of hydrogen per unit volume of the first barrier layer 410 is lower than the content of hydrogen per unit volume of the second barrier layer 420. That is, the second barrier layer 420 may be formed such that the content of hydrogen per unit volume of the second barrier layer 420 is higher than the content of hydrogen per unit volume of the first barrier layer 410. In this case, as described above, the formation rate of the first barrier layer 410 may be slower than the formation rate of the second barrier layer 420.

As described above, the bottom surface of the barrier layer 400 is in contact with the display substrate 300, and the higher the flatness of the bottom surface of the barrier layer 400, the smaller the surface area where the barrier layer 400 and the display substrate 300 come into contact with each other. When the area where the barrier layer 400 and the display substrate 300 are in contact with each other is reduced, the electrostatic attraction between the barrier layer 400 and the display substrate 300 may be minimized. That is, the electrostatic attraction between the barrier layer 400 and the display substrate 300 affects the electrostatic attraction between the plasma-treated first inorganic layer 220 and the display substrate 300. In detail, when the electrostatic attraction between the barrier layer 400 and the display substrate 300 is reduced, the electrostatic attraction between the plasma-treated first inorganic layer 220 and the display substrate 300 is also reduced.

According to the method of manufacturing a display apparatus of the present embodiment, the barrier layer 400 includes the first barrier layer 410 and the second barrier layer 420. The first barrier layer 410 which has a higher flatness than the second barrier layer 420 is arranged between the second barrier layer 420 and the display substrate 300. Accordingly, the electrostatic attraction between the barrier layer 400 and the display substrate 300 is minimized. Thus, the electrostatic attraction between the plasma-treated first inorganic layer 220 and the display substrate 300 is minimized as well. Consequently, the display substrate 300 may be later easily separated from the plasma-treated first inorganic layer 220.

Figure 6:
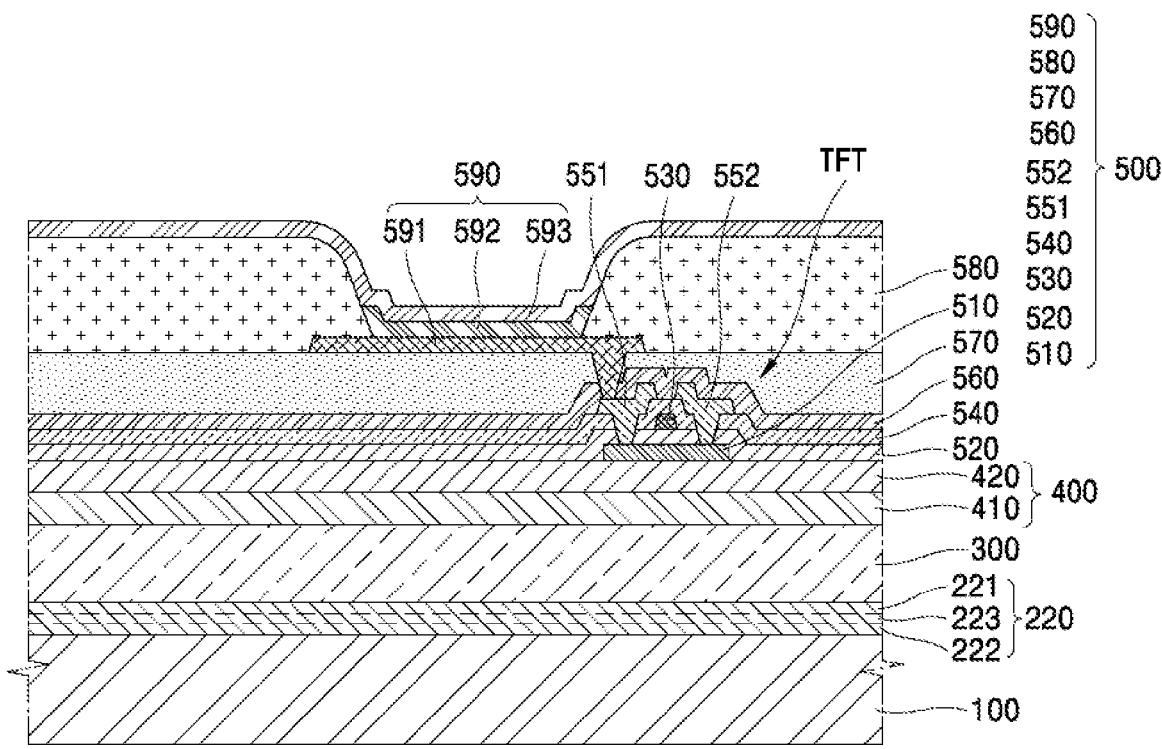
FIG. 6 is a schematic cross-sectional view for describing an operation of forming a display element layer, among operations included in a method of manufacturing a display apparatus, according to an embodiment.

After forming the barrier layer 400 as described above, the display element layer 500 may be formed on the display substrate 300 as illustrated in FIG. 6. In detail, the display element layer 500 may be formed on the second barrier layer 420.

The display element layer 500 may include a display element 590 and a thin film transistor TFT, to which the display element 590 is electrically connected. In FIG. 6, as the display element 590, an organic light-emitting device located on the barrier layer 400 is illustrated. The organic light-emitting device being electrically connected to the thin film transistor TFT may be understood as meaning that a pixel electrode 591 of the organic light-emitting device is electrically connected to the thin film transistor TFT.

As illustrated in FIG. 6, the thin film transistor (TFT) includes a semiconductor layer 510 including amorphous silicon, polycrystalline silicon, an oxide semiconductor material or an organic semiconductor material, a gate electrode 530, and a source electrode 551. In order to secure insulation between the semiconductor layer 510 and the gate electrode 530, a gate insulating layer 520 including an inorganic material such as silicon oxide, silicon nitride and/or silicon oxynitride may be disposed between the semiconductor layer 510 and the gate electrode 530. In addition, a first interlayer insulating layer 540 including an inorganic material such as silicon oxide, silicon nitride and/or silicon oxynitride may be disposed on the gate electrode 530, and a second interlayer insulating layer 560 may be arranged to cover the source electrode 551 and the drain electrode 552 simultaneously. As such, an insulating layer including an inorganic material may be formed by CVD or ALD. However, the present disclosure is not limited thereto.

A planarization layer 570 may be disposed on the thin film transistor TFT and the second interlayer insulating layer 560. For example, as illustrated in FIG. 6, when the organic light-emitting device is disposed on the thin film transistor TFT, the planarization layer 570 may have a function of generally planarizing an upper portion of the thin film transistor TFT. The planarization layer 570 may include an organic material such as acryl, benzocycicobutene (BCB), or hexamethyldisiloxane (HMDSO). While the planarization layer 570 is illustrated as a single-layer structure in FIG. 6, various modifications may also be made; for example, the planarization layer 570 may have a multi-layer structure.

In a display area of the display element layer 500, the display element 590 may be positioned on the planarization layer 570. The display element 590 may include, for example, an organic light-emitting device having the pixel electrode 591, an opposite electrode 593, and an intermediate layer 592 arranged between the pixel electrode 591 and the opposite electrode 593 and including an emission layer.

The pixel electrode 591 may contact one of the source electrode 551 and the drain electrode 552 through a contact hole formed in the planarization layer 570 or the like, as illustrated in FIG. 6, to be electrically connected to the thin-film transistor TFT. The pixel electrode 591 includes a transmissive conductive layer including a transmissive conductive oxide such as indium tin oxide (ITO), $In_2O_3$ or indium zinc oxide (IZO) and a reflective layer including a metal such as Al or Ag. For example, the pixel electrode 591 may have a three-layered structure including ITO/Ag/ITO.

A pixel defining layer 580 may be disposed on the planarization layer 570. The pixel defining layer 580 defines pixels by having an opening corresponding to each pixel, that is, an opening, through which at least a center portion of the pixel electrode 591 is exposed. In addition, in the embodiment illustrated in FIG. 6, the pixel defining layer 580 increases a distance between an edge of the pixel electrode 591 and the opposite electrode 593 on the pixel electrode 591 to thereby prevent an arc or the like at the edge of the pixel electrode 591. The pixel defining layer 580 may include an organic material such as polyimide or HMDSO.

The intermediate layer 592 of the organic light-emitting device may include a low-molecular weight material or a polymer material. When the intermediate layer 592 includes a low-molecular weight material, the intermediate layer 592 may have a structure in which a hole injection layer (HIL), a hole transport layer (HTL), an emission layer (EML), and an electron transport layer (ETL), and an electron injection layer (EIL), or the like are stacked in a single or composite structure, and may be formed by vacuum deposition. When the intermediate layer 592 includes a polymer material, the intermediate layer 592 may have a structure including an HTL and an EML. Here, the HTL may include PEDOT, and the EML may include a polymer material such as a polyphenylvinylene (PPV)-based material and a polyfluorene-based material. The intermediate layer 592 may be formed by screen printing, inkjet printing, laser induced thermal imaging (LITI), or the like. The intermediate layer 592, however, is not necessarily limited thereto, and may have other various structures. In addition, the intermediate layer 592 may include a layer that is integrally formed over a plurality of pixel electrodes 591, or may include a layer patterned to correspond to each of the plurality of pixel electrodes 591.

The opposite electrode 593 is disposed on the intermediate layer 592 to cover the display area. The opposite electrode 593 may be formed integrally with respect to a plurality of organic light-emitting devices to correspond to the plurality of pixel electrodes 591. The opposite electrode 593 may include a transmissive conductive layer including ITO, $In_2O_3$ or IZO, and a semi-transmissive layer including a metal such as Al or Ag. For example, the opposite electrode 593 may include a semi-transmissive layer including MgAg.

Figure 7:
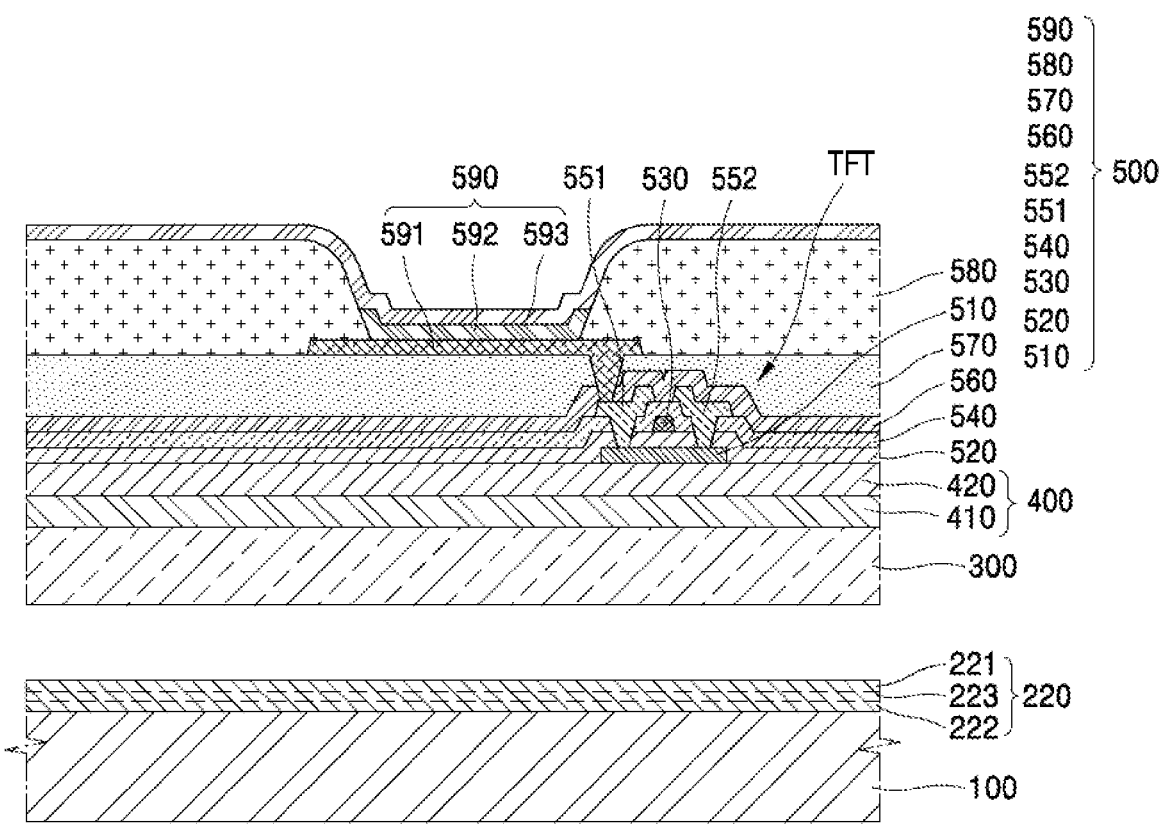
FIG. 7 is a schematic cross-sectional view for describing an operation of separating a display substrate from a carrier substrate, among operations included in a method of manufacturing a display apparatus, according to an embodiment.

After forming the display element layer 500 as described above, the display substrate 300 may be separated from the carrier substrate 100 as illustrated in FIG. 7. In detail, the display substrate 300 may be separated from the plasma-treated first inorganic layer 220. For example, the display substrate 300 may be separated from the carrier substrate 100 by irradiating, with ultraviolet laser, one surface of the display substrate 300 facing the plasma-treated first inorganic layer 220. In this case, the plasma-treated first inorganic layer 220 is positioned on the carrier substrate 100, and the first barrier layer 410, the second barrier layer 420, and the display element layer 500 may be positioned on the display substrate 300. However, the present disclosure is not limited thereto.

Figure 8:
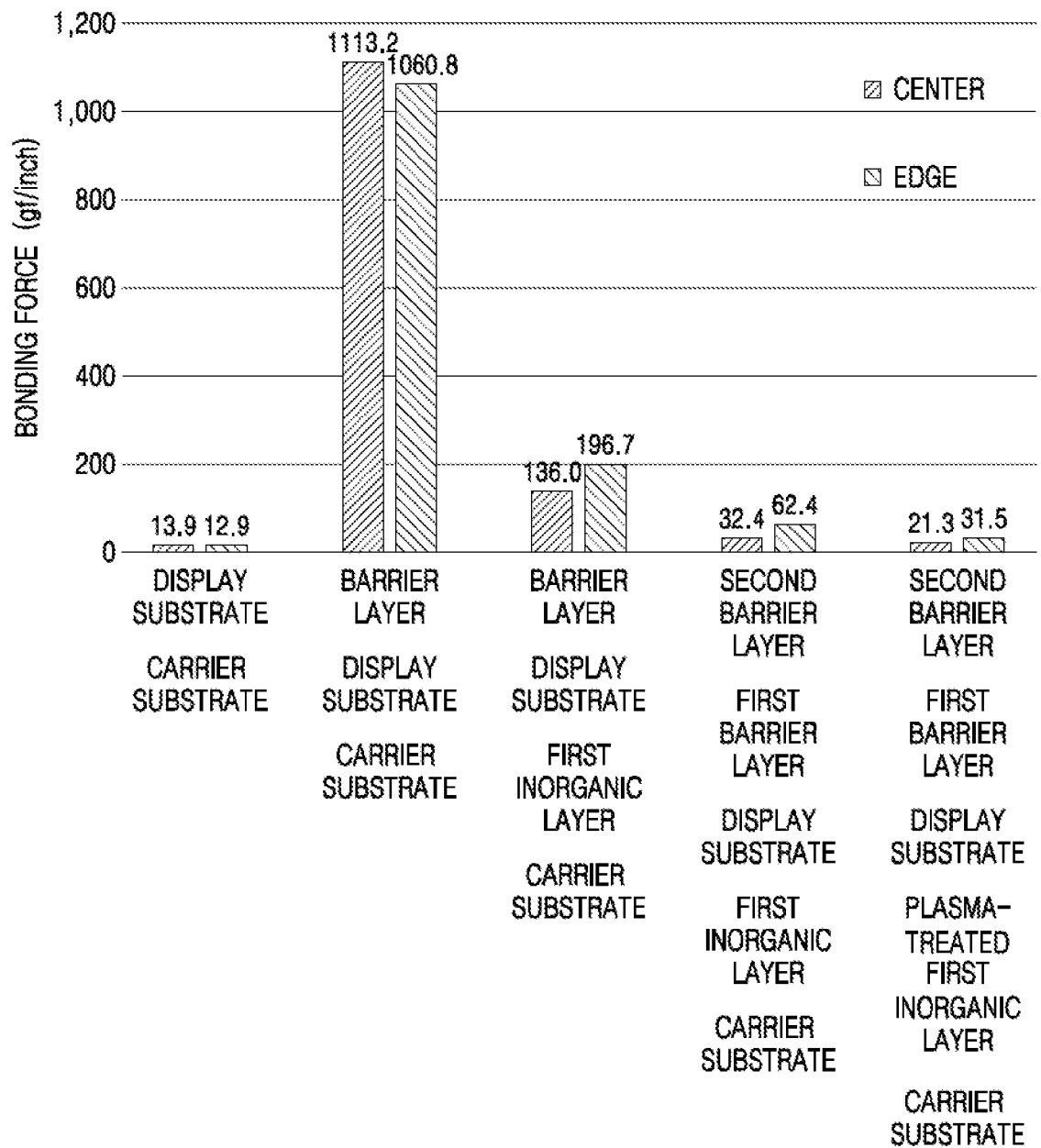
FIG. 8 shows a result of measuring a bonding force of a display apparatus in a manufacturing process in a method of manufacturing a display apparatus, according to an embodiment, and a bonding force of a display apparatus in a manufacturing process of a method of manufacturing a display apparatus according to a comparative example.

FIG. 8 shows a result of measuring a bonding force of a display substrate in a manufacturing process of a display apparatus. Bar graphs located first and second from the left of FIG. 8 (Display Substrate/Carrier Substrate) indicate a bonding force between the carrier substrate 100 and the display substrate 300 before the barrier layer 400 is formed on the display substrate 300. In detail, the bar graph located first from the left indicates a center bonding force between the carrier substrate 100 and the display substrate 300, and the bar graph located second from the left indicates an edge bonding force between the carrier substrate 100 and the display substrate 300. As used herein, the term "center bonding force" refers to a bonding force at centers of two substrates to be bonded to each other, and the term "edge bonding force" refers to a bonding force at edges of two substrates to be bonded to each other.

Bar graphs located third and fourth from the left of FIG. 8 (Barrier Layer/Display Substrate/Carrier Substrate) indicate a bonding force between the carrier substrate 100 and the display substrate 300 after the barrier layer 400 is formed on the display substrate 300. In detail, the bar graph located third from the left indicates the center bonding force between the carrier substrate 100 and the display substrate 300, and the bar graph located fourth from the left indicates the edge bonding force between the carrier substrate 100 and the display substrate 300. The bar graphs located fifth and sixth from the left of FIG. 8 (Barrier Layer/Display Substrate/First Organic Layer/Carrier Substrate) indicate a bonding force between the first inorganic layer 210 and the display substrate 300 after the first inorganic layer 210, the display substrate 300, and the barrier layer 400 are sequentially formed on the carrier substrate 100. In detail, the bar graph located fifth from the left indicates a center bonding force between the first inorganic layer 210 and the display substrate 300, and the bar graph located sixth from the left indicates an edge bonding force between the first inorganic layer 210 and the display substrate 300.

Bar graphs located seventh and eighth from the left of FIG. 8 (Second Barrier Layer/First Barrier Layer/Display Substrate/First Organic Layer/Carrier Substrate) indicate the bonding force between the first inorganic layer 210 and the display substrate 300 after the first inorganic layer 210, the display substrate 300, the first barrier layer 410, and the second barrier layer 420, are sequentially formed on the carrier substrate 100. In detail, the bar graph located seventh from the left indicates the center bonding force between the first inorganic layer 210 and the display substrate 300, and the bar graph located eighth from the left indicates the edge bonding force between the first inorganic layer 210 and the display substrate 300. Bar graphs located ninth and tenth from the left of FIG. 8 (Second Barrier Layer/First Barrier Layer/Display Substrate/Plasma-Treated First Organic Layer/Carrier Substrate) indicate a bonding force between the plasma-treated first inorganic layer 220 and the display substrate 300 after the first inorganic layer 210 before plasma treatment is formed on the carrier substrate 100, and the first inorganic layer 210 before plasma treatment is plasma-treated using nitrous oxide gas, and the display substrate 300, the first barrier layer 410, and the second barrier layer 420 are sequentially formed on the plasma-treated first inorganic layer 220. In detail, the bar graph located ninth from the left indicates the center bonding force between the plasma-treated first inorganic layer 220 and the display substrate 300, and the bar graph located tenth from the left indicates an edge bonding force between the plasma-treated first inorganic layer 220 and the display substrate 300.

On the other hand, before separating the display substrate 300 from the carrier substrate 100, the barrier layer 400 is formed on the display substrate 300 as described above, and thus, by the forming of the barrier layer 400, the bonding force between the carrier substrate 100 and the display substrate 300 may be increased, making it difficult to separate the display substrate 300 from the carrier substrate 100. In detail, when the barrier layer 400 is formed on the display substrate 300, to use plasma, a voltage is applied to the carrier substrate 100 and the display substrate 300. In this case, dipoles in the carrier substrate 100 and the display substrate 300 are aligned in a line, and accordingly, the bonding force between the carrier substrate 100 and the display substrate 300 is increased. Accordingly, it is difficult to separate the display substrate 300 from the carrier substrate 100.

For example, as shown in FIG. 8, which is a result of measuring the bonding force of the display substrate 300 in the manufacturing process of the manufacturing method of a display apparatus, a center bonding force and an edge bonding force between the carrier substrate 100 and the display substrate 300 before forming the barrier layer 400 on the display substrate 300 are 13.9 gf/inch and 12.9 gf/inch, respectively. However, after forming the barrier layer 400 on the display substrate 300, the center bonding force and the edge bonding force between the carrier substrate 100 and the display substrate 300 are 1113.2 gf/inch and 1060.8 gf/inch, respectively. That is, as described above, as the barrier layer 400 is formed on the display substrate 300, the bonding force between the carrier substrate 100 and the display substrate 300 is significantly increased.

Electrostatic attraction is generated between the impurities of the carrier substrate 100 and the display substrate 300, and the barrier layer 400 is formed by PECVD. When the barrier layer 400 is formed, the electrostatic attraction between the impurities of the carrier substrate 100 and the display substrate 300 is significantly increased by the voltage applied in PECVD. The electrostatic attraction significantly increases the bonding force between the carrier substrate 100 and the display substrate 300. Accordingly, it is difficult to separate the display substrate 300 from the carrier substrate 100.

In addition, silicon oxide included in the carrier substrate 100 consists of oxygen (O) and silicon (Si). Silicon may form a bond with not only a plurality of oxygens included in the carrier substrate 100 but also with oxygens included in the display substrate 300. For example, some of silicons included in the carrier substrate 100 form a covalent bond with oxygen included in the display substrate 300. The covalent bond increases the bonding force between the carrier substrate 100 and the display substrate 300, thus making it difficult to separate the display substrate 300 from the carrier substrate 100.

On the other hand, as the first inorganic layer 210 before plasma treatment is formed using a deposition method, the first inorganic layer 210 before plasma treatment has no or minimized impurities than the carrier substrate 100. Accordingly, by forming the first inorganic layer 210 before plasma treatment, between the carrier substrate 100 and the display substrate 300, electrostatic attraction between impurities included in layers located below the display substrate 300 and the display substrate 300 may be prevented or minimized.

In addition, as the first inorganic layer 210 before plasma treatment is formed using a deposition method, the first inorganic layer 210 before plasma treatment of silicon covalently bonded to oxygen included in the display substrate 300 may be eliminated or minimized. Accordingly, the first inorganic layer 210 before plasma treatment may allow the display substrate 300 to be easily separated from the carrier substrate 100.

For example, as shown in FIG. 8, which shows the result of measuring the bonding force of the display substrate in the manufacturing process of the manufacturing method of a display apparatus, when the first inorganic layer 210 before plasma treatment is not performed between the carrier substrate 100 and the display substrate 300, the center bonding force and the edge bonding force between the carrier substrate 100 and the display substrate 300 are 1113.2 gf/inch and 1060.8 gf/inch, respectively. On the other hand, when the first inorganic layer 210 before plasma treatment is performed between the carrier substrate 100 and the display substrate 300, the center bonding force and the edge bonding force between the carrier substrate 100 and the display substrate 300 are 136.0 gf/inch and 196.7 gf/inch, respectively. That is, as the first inorganic layer 210 before plasma treatment is formed on the carrier substrate 100, the bonding force between the layers located below the display substrate 300 and the display substrate 300 is reduced.

As described above, the higher the flatness of the bottom surface of the barrier layer 400, the smaller the area where the barrier layer 400 and the display substrate 300 are in contact with each other. When the barrier layer 400 includes the first barrier layer 410 and the second barrier layer 420, by making the first barrier layer 410, which has a higher flatness than the second barrier layer 420, to contact the display substrate 300, the electrostatic attraction between the barrier layer 400 and the display substrate 300 may be minimized.

The electrostatic attraction between the barrier layer 400 and the display substrate 300 affects the electrostatic attraction between the plasma-treated first inorganic layer 220 and the display substrate 300. In detail, when the electrostatic attraction between the barrier layer 400 and the display substrate 300 is reduced, the electrostatic attraction between the plasma-treated first inorganic layer 220 and the display substrate 300 is also reduced. Thus, the display substrate 300 may be easily separated from the plasma-treated first inorganic layer 220.

For example, as shown in FIG. 8, which shows the result of measuring the bonding force of the display substrate in the manufacturing process of the manufacturing method of a display apparatus, when the barrier layer 400 is a single layer, the center bonding force and the edge bonding force between the first inorganic layer 210 before performing plasma treatment and the display substrate 300 are 136.0 gf/inch and 196.7 gf/inch, respectively. Unlike the above, when the barrier layer 400 includes the first barrier layer 410 and the second barrier layer 420, the center bonding force and the edge bonding force between the first inorganic layer 210 before performing plasma treatment and the display substrate 300, are 32.4 gf/inch and 62.4 gf/inch, respectively. That is, as described above, as the first barrier layer 410 is formed on the display substrate 300, the bonding force between the layers located below the display substrate 300 and the display substrate 300 is reduced.

Meanwhile, as described above, the first inorganic layer 210 before performing plasma treatment, on which the display substrate 300 is formed, contains a plurality of oxygen atoms, some of the oxygen atoms being present in hydroxyl groups. That is, the first inorganic layer 210 before performing plasma treatment includes hydroxyl groups. When the display substrate 300 is formed on the first inorganic layer 210, which is before performing plasma treatment and includes the hydroxyl groups, electrostatic attraction may be generated between the display substrate 300 and the hydroxyl groups included in the first inorganic layer 210 before performing plasma treatment. In addition, the hydroxyl groups included in the first inorganic layer 210 before performing plasma treatment may form a hydrogen bond with hydroxyl groups included in the display substrate 300. In addition, a dangling bond capable of making a chemical bond with the display substrate 300 is present on the upper surface of the first inorganic layer 210 before plasma treatment. Electrostatic attraction, a hydrogen bond, and a dangling bond increase the bonding force between the carrier substrate 100 and the display substrate 300. Accordingly, it is difficult to later separate the display substrate 300 from the first inorganic layer 210 before performing plasma treatment.

However, according to the method of manufacturing a display apparatus of the present embodiment, as described above, as the first inorganic layer 210 before plasma treatment is plasma-treated using nitrous oxide gas, the plasma-treated first inorganic layer 220 has fewer hydroxyl groups than the first inorganic layer 210 before plasma treatment. Accordingly, electrostatic attraction does not occur and a hydrogen bond is not formed between hydroxyl groups of the plasma-treated first inorganic layer 220 and the display substrate 300, or the magnitude of the attraction may be minimized. In addition, as the first inorganic layer 210 before performing plasma treatment is plasma-treated using nitrous oxide gas, fewer dangling bonds exist on the upper surface of the plasma-treated first inorganic layer 220 than on the upper surface of the first inorganic layer 210 before performing plasma treatment. Accordingly, the bonding force between the plasma-treated first inorganic layer 220 and the display substrate 300 is lower than the bonding force between the display substrate 300 and the first inorganic layer 210 before performing plasma treatment. Thus, the display substrate 300 may be easily separated from the plasma-treated first inorganic layer 220.

For example, as shown in FIG. 8, which shows the result of measuring the bonding force of the display substrate in the manufacturing process of the manufacturing method of a display apparatus, the center bonding force and the edge bonding force between the first inorganic layer 210 before performing plasma treatment and the display substrate 300, are 32.4 gf/inch and 62.4 gf/inch, respectively. In addition, the center bonding force and the edge bonding force between the plasma-treated first inorganic layer 220 and the display substrate 300, were 21.3 gf/inch and 31.5 gf/inch, respectively. That is, as the first inorganic layer 210 before plasma treatment is plasma-treated, the bonding force between the layers located below the display substrate 300 and the display substrate 300 may be reduced. Moreover, a difference in a bonding force between in a center portion and at edges of the display substrate 300 is less between the first inorganic layer 210 before performing plasma treatment and the display substrate 300 than between the plasma-treated first inorganic layer 220 and the display substrate 300. That is, when the first inorganic layer 210 is plasma-treated, variation in the bonding force between the layers located below the display substrate 300 and the display substrate 300 is reduced, and thus uniformity of the bonding force is improved.

Above, the method of manufacturing a display apparatus has been described, but the present disclosure is not limited thereto. For example, a display apparatus manufactured by the above manufacturing method also falls within the scope of the present disclosure. Hereinafter, the display apparatus will be described. Effects of the display apparatus manufactured are described above and thus omitted here, and only a structure of the display apparatus 1 is now described.

Figure 9:
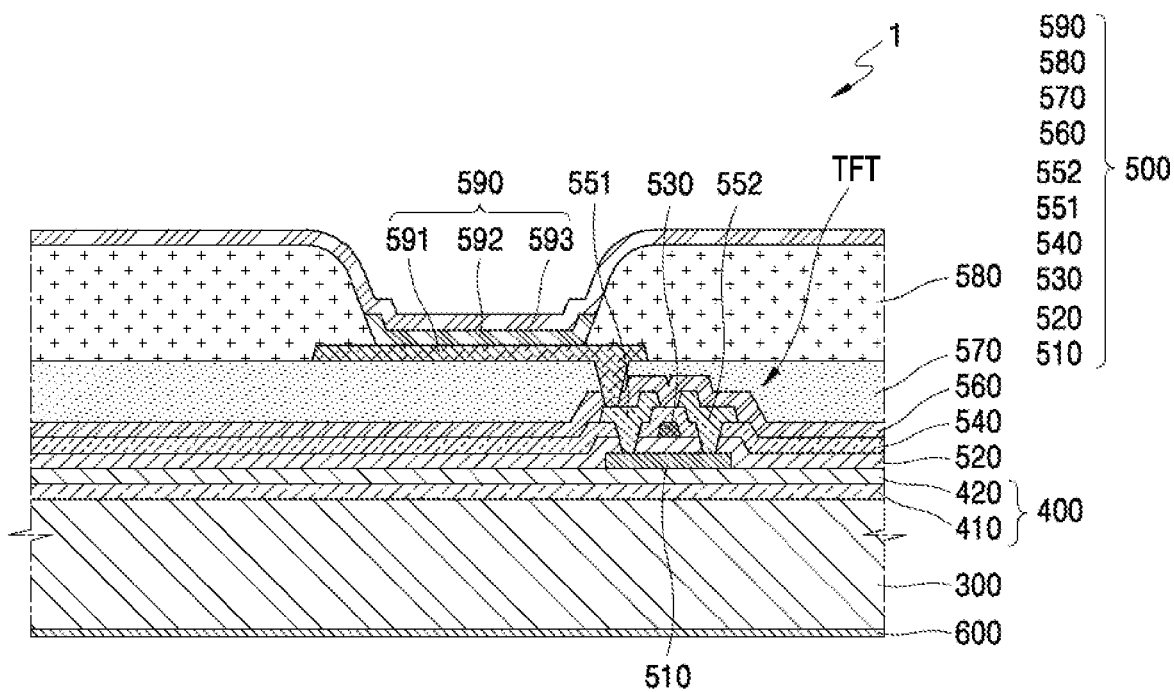
FIG. 9 is a schematic cross-sectional view of a display apparatus according to an embodiment.

For example, a display apparatus 1 according to an embodiment may have a structure as illustrated in FIG. 9. Hereinafter, for convenience, description of repeated details provided above with reference to FIGS. 1, 2, 3, 4, 5, 6, 7, and 8 is omitted.

As illustrated in FIG. 9, the display apparatus 1 includes the display substrate 300, and the display element layer 500 may be disposed on one surface of the display substrate 300. Meanwhile, a second inorganic layer 600 may be disposed on the other surface of the display substrate 300 facing away from the display element layer 500, and the second inorganic layer 600 may include silicon oxide. However, the present disclosure is not limited thereto. For example, the second inorganic layer 600 may include silicon nitride or silicon oxynitride. The second inorganic layer 600 may include the same material as the first inorganic layer 220 that is plasma-treated in the method for manufacturing a display apparatus, according to an embodiment. Before the display substrate 300 is separated from the carrier substrate 100, the plasma-treated first inorganic layer 220 is in contact with the other surface of the display substrate 300. A portion of the plasma-treated first inorganic layer 220 may remain on the other surface of the display substrate 300 after the display substrate 300 is separated from the carrier substrate 100. The second inorganic layer 600 may be a portion of the plasma-treated first inorganic layer 220 remaining on the other surface of the display substrate 300.

A content of oxygen per unit volume in the second inorganic layer 600 may vary according to positions in the second inorganic layer 600. In detail, the content of oxygen per unit volume of the second inorganic layer 600 may increase from a bottom surface of the second inorganic layer 600 toward an upper surface of the second inorganic layer 600 facing the display substrate 300. Before the display substrate 300 is separated from the carrier substrate 100, the content of oxygen per unit volume of the plasma-treated first inorganic layer 220 increases from the bottom surface of the plasma-treated first inorganic layer 220 facing the carrier substrate 100 to the upper surface of the plasma-treated first inorganic layer 220. Accordingly, the content of oxygen per unit volume of the second inorganic layer 600, which is a portion of the plasma-treated first inorganic layer 220 remaining on the other surface of the display substrate 300, may increase from the bottom surface of the second inorganic layer 600 toward the upper surface of the second inorganic layer 600 facing the display substrate 300.

A content of hydrogen per unit volume in the second inorganic layer 600 may vary according to positions in the second inorganic layer 600. In detail, the content of hydrogen per unit volume of the second inorganic layer 600 may decrease from the bottom surface of the second inorganic layer 600 to the upper surface of the second inorganic layer 600 facing the display substrate 300. Before the display substrate 300 is separated from the carrier substrate 100, the content of hydrogen per unit volume of the plasma-treated first inorganic layer 220 decreases from the bottom surface of the plasma-treated first inorganic layer 220 facing the carrier substrate 100 to the upper surface of the plasma-treated first inorganic layer 220. Accordingly, the content of hydrogen per unit volume of the second inorganic layer 600, which is a portion of the plasma-treated first inorganic layer 220 remaining on the other surface of the display substrate 300, may decrease from the bottom surface of the second inorganic layer 600 to the upper surface of the second inorganic layer 600 facing the display substrate 300.

The display apparatus 1 may further include the first barrier layer 410 disposed between the display substrate 300 and the display element layer 500 and the second barrier layer 420 disposed between the first barrier layer 410 and the display element layer 500. The first barrier layer 410 may include silicon oxide. In addition, the second barrier layer 420 may also include silicon oxide. However, the present disclosure is not limited thereto. For example, the first barrier layer 410 and/or the second barrier layer 420 may include silicon nitride or silicon oxynitride.

The contents of the components of the first barrier layer 410 and the contents of the components of the second barrier layer 420 may be different from each other. For example, the content of oxygen per unit volume of the first barrier layer 410 may be higher than the content of oxygen per unit volume of the second barrier layer 420, or the content of hydrogen per unit volume of the first barrier layer 410 may be higher than the content of hydrogen per unit volume of the second barrier layer 420. That is, the content of oxygen per unit volume of the second barrier layer 420 may be lower than the content of oxygen per unit volume of the first barrier layer 410, or the content of hydrogen per unit volume of the second barrier layer 420 may be higher than the content of hydrogen per unit volume of the first barrier layer 410.

According to the embodiment as described above, a display apparatus, which may be easily separated from a carrier substrate may be implemented. However, the scope of the present disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising steps of:
   forming, on a carrier substrate, a first inorganic layer including silicon oxide;
   plasma-treating the first inorganic layer by using nitrous oxide gas ($N_2O$) and varying a content of oxygen per unit volume in the first inorganic layer according to positions within the first inorganic layer;
   after the plasma-treating, forming a display substrate on the first inorganic layer;
   forming a display element layer disposed on the display substrate; and
   separating the display substrate from the carrier substrate.

2. The method of claim 1, wherein the plasma-treating the first inorganic layer is accomplished by plasma-treating an upper surface of the first inorganic layer.

3. The method of claim 1, wherein the plasma-treating the first inorganic layer is accomplished by making the content of oxygen per unit volume in the first inorganic layer increase from a bottom surface of the first inorganic layer which faces the carrier substate to an upper surface of the first inorganic layer.

4. The method of claim 1, wherein the plasma-treating the first inorganic layer is accomplished by making a content of oxygen per unit volume in a first portion of the first inorganic layer facing away from the carrier substrate be higher than a content of oxygen per unit volume in a second portion of the first inorganic layer, the second portion being closer than the first portion to the carrier substrate.

5. The method of claim 4, wherein the plasma-treating the first inorganic layer is accomplished by making a content of oxygen per unit volume in a third portion of the first inorganic layer be higher from a bottom surface of the third portion facing the carrier substrate to an upper surface of the third portion, the third portion being located between the first portion and the second portion.

6. The method of claim 1, further comprising, between the forming of the display substrate and the forming of the display element layer, forming, on the display substrate, a first barrier layer including silicon oxide.

7. The method of claim 6, further comprising, between the forming of the first barrier layer and the forming of the display element layer, forming, on the display substrate, a second barrier layer including silicon oxide.

8. The method of claim 7, wherein the forming of the second barrier layer is accomplished by forming the second barrier layer such that a content of oxygen per unit volume of the second barrier layer is lower than a content of oxygen per unit volume of the first barrier layer.

9. The method of claim 7, wherein the forming of the second barrier layer is accomplished by forming the second barrier layer such that a content of hydrogen per unit volume of the second barrier layer is higher than a content of hydrogen per unit volume of the first barrier layer.

10. The method of claim 1, wherein the separating the display substrate from the carrier substrate is accomplished by separating the display substrate from the first inorganic layer.

11. A method of manufacturing a display apparatus, the method comprising steps of:
   forming, on a carrier substrate, a first inorganic layer including silicon oxide;
      plasma-treating the first inorganic layer by using nitrous oxide gas ($N_2O$) and varying a content of hydrogen per unit volume in the first inorganic layer according to positions within the first inorganic layer;
   after the plasma-treating, forming a display substrate on the first inorganic layer;
   forming a display element layer disposed on the display substrate; and
   separating the display substrate from the carrier substrate.

12. The method of claim 11, wherein the plasma-treating the first inorganic layer is accomplished by making the content of hydrogen per unit volume of the first inorganic layer decrease from the bottom surface of the first inorganic layer which faces the carrier substrate to the upper surface of the first inorganic layer.

13. The method of claim 11, wherein the plasma-treating the first inorganic layer is accomplished by making a content of hydrogen per unit volume in a first portion of the first inorganic layer facing away from the carrier substrate be lower than a content of hydrogen per unit volume in a second portion of the first inorganic layer, the second portion being closer than the first portion to the carrier substrate.

14. The method of claim 13, wherein the plasma-treating the first inorganic layer is accomplished by making a content of hydrogen per unit volume in a third portion of the first inorganic layer be lower from a bottom surface of the third portion facing the carrier substrate to an upper surface of the third portion, the third portion being located between the first portion and the second portion.

15. A display apparatus comprising:
   a display substrate;
   a display element layer disposed on one surface of the display substrate; and
   a second inorganic layer disposed on an other surface of the display substrate and including silicon oxide, wherein a content of oxygen per unit volume of the second inorganic layer increases in a direction toward the display substrate.

16. The display apparatus of claim 15, wherein a content of hydrogen per unit volume of the second inorganic layer decreases from a bottom surface of the second inorganic layer to an upper surface of the second inorganic layer which faces the display substrate.

17. The display apparatus of claim 15, further comprising:
   a first barrier layer arranged between the display substrate and the display element layer; and
   a second barrier layer arranged between the first barrier layer and the display element layer.

18. The display apparatus of claim 17, wherein a content of oxygen per unit volume of the second barrier layer is lower than a content of oxygen per unit volume of the first barrier layer.

19. The display apparatus of claim 17, wherein a content of hydrogen per unit volume of the second barrier layer is higher than a content of hydrogen per unit volume of the first barrier layer.

* * * * *